United States Patent
Martinotto et al.

(10) Patent No.: US 7,459,320 B2
(45) Date of Patent: Dec. 2, 2008

(54) METHOD FOR PRODUCING A PHOTOVOLTAIC DEVICE

(75) Inventors: Luca Martinotto, Milan (IT); Andrea Pelizzoni, Milan (IT); Xicola Agustin Sin, Milan (IT)

(73) Assignee: Pirelli & C. S.p.A., Milan (IT)

( * ) Notice: Subject to any disclaimer, the term of this patent is extended or adjusted under 35 U.S.C. 154(b) by 322 days.

(21) Appl. No.: 10/551,172

(22) PCT Filed: Mar. 26, 2004

(86) PCT No.: PCT/EP2004/003220

§ 371 (c)(1),
(2), (4) Date: Jul. 11, 2006

(87) PCT Pub. No.: WO2004/087318

PCT Pub. Date: Oct. 14, 2004

(65) Prior Publication Data

US 2007/0178241 A1    Aug. 2, 2007

(30) Foreign Application Priority Data

Mar. 31, 2003    (EP)    .................................... 0303333

(51) Int. Cl.
*H01L 21/00* (2006.01)
(52) U.S. Cl. .......................................... 438/22; 438/48
(58) Field of Classification Search .................. 438/22, 438/48

See application file for complete search history.

(56) References Cited

U.S. PATENT DOCUMENTS

| 5,368,834 | A * | 11/1994 | Kulwicki et al. ............ 423/598 |
| 6,576,589 | B1 | 6/2003 | Na et al. |
| 6,589,457 | B1 * | 7/2003 | Li et al. ........................ 264/44 |
| 2003/0188776 | A1 | 10/2003 | Li et al. |
| 2003/0224152 | A1 * | 12/2003 | Yokoyama et al. .......... 428/209 |
| 2005/0043454 | A1 * | 2/2005 | Ushida et al ................. 524/241 |

FOREIGN PATENT DOCUMENTS

| EP | 0 859 385 A1 | 8/1998 |
| EP | 1 167 296 A1 | 1/2002 |
| EP | 1 182 169 A1 | 2/2002 |
| JP | 200-104797 | 4/2001 |

OTHER PUBLICATIONS

Kotani et al.; "Formation of Anatase Nanocrystals in Sol-Gel Derived $TiO_2$-$SiO_2$ Thin Films With Hot Water Treatment"; Journal of Sol-Gel Science and Technology, vol. 19, pp. 585-599, (2000).

Matsuda et al.; "Transparent Anatase Nanocomposite Films by the Sol-Gel Process at Low Temperatures"; J. Am. Ceram. Soc. vol. 83, No. 1, pp. 229-231, (2000).

* cited by examiner

*Primary Examiner*—Walter L. Lindsay, Jr.
*Assistant Examiner*—Kenisha V Ford
(74) *Attorney, Agent, or Firm*—Finnegan, Henderson, Farabow, Garrett & Dunner, L.L.P.

(57) ABSTRACT

Process for preparing a photovoltaic device including at least one semiconductive metal oxide with a major amount of a nanosized photo-catalytic crystalline phase, by depositing the oxide in the presence of a hydrosoluble organic polymer and a hydrolysable organic derivative of metal of the metal oxide under non-destructive conditions.

21 Claims, 1 Drawing Sheet

METHOD FOR PRODUCING A PHOTOVOLTAIC DEVICE

CROSS REFERENCE TO RELATED APPLICATION

This application is a national phase application based on PCT/EP2004/003220, filed Mar. 26, 2004, the content of which is incorporated herein by reference, and claims the priority of PCT/EP03/03333, the content of which is incorporated herein by reference.

BACKGROUND OF THE INVENTION

1. Field of the Invention

The present invention relates to a method for producing a photovoltaic device comprising a photovoltaic cell including at least one film of a semiconductive metal oxide.

2. Description of the Related Art

Semiconductive metal oxides such as oxides of titanium, zirconium, hafnium, strontium, zinc, indium, yttrium, lanthanum, vanadium, tantalum, niobium, chromium, molybdenum, tungsten, show a crystalline phase exhibiting photocatalytic functionality, and can be use in a variety of applications. For example, Titania ($TiO_2$) has several crystalline phases such as anatase, rutile and brookite. Among these crystalline phases, the anatase one exhibits higher photocatalytic properties and photovoltaic effect and thus has attracted much attention in these fields.

Nanosized anatase titania film have been studied for applications such as solar cells, photocatalysts, antibacterial coating, electrochromic display, anti-reflecting coating and gas sensors. The photovoltaic devices fall within the general class referred to as dye-sensitized solar cells, as reported, e.g., by U.S. 2003/0188776.

Presently, many applications would benefit from the availability of a photovoltaic cell or module, for example, the so-called "smart cards", i.e., electronic cards capable of storing information and used, e.g., for payphone telephony, digital mobile telephony, the credit and debit functions of financial institutions, retail loyalty schemes, corporate staff systems, subscription TV operations, mass transit ticketing schemes and the like.

Typically, these cards comprises an information module, which provides information (e.g., electronic data or an audiovisual response) to a user or to a card reader, and a photovoltaic cell that powers the information module. The information module and the photovoltaic cell are typically supported on a polymeric substrate.

Thin films based on nanoparticles of anatase titania show high photocatalytic activity depending on phase, crystal dimension and surface area, and porosity. As reported by Yoshinori Kotani et al. Journal of Sol-Gel Science and Technology 19, 585-588, 2000, the sol-gel method is one of the most promising techniques to prepare thin films because it has a number of advantages such as low-temperature processing and the ability to prepare materials in various shapes, compared with the conventional preparation procedures of glass and ceramics. However, as-prepared films by the sol-gel method are usually amorphous, and a high temperature process over 300° C. is required to form anatase nanocrystals. Therefore, it is difficult to form anatase nanocrystals on the substrates with poor heat resistance such as organic polymers.

EP-A-0 859 385 (in the name of Monsanto Company) discloses a method for manufacturing photovoltaic cells comprising polycrystalline oxides exhibiting semiconductor functionality. Particles of the polycrystalline metal oxide can be prepared by hydrolysis of the corresponding metal alkoxide followed by optional physical treatments such as growth and particle size control through digestion under hydrothermal conditions at temperatures in the range of from 150 to 250° C., followed by high temperature (200-500° C.) sintering and grinding of the resulting sintered product to the required particle size. Said particles are then dye coated and suspended to yield a ink suspension, optionally containing additives, e.g. dispersants which can enhance the even distribution of the ink particles on the substrate where the ink suspension is deposited to yield a uniform layer. The so deposited layer is treated under mild and non-destructive conditions including temperatures below 180-150° C., possibly combined with non-destructive pressure e.g. below 20 bars, and/or evaporation under sub-atmospheric pressures. No specific examples are provided.

EP-A-1 167 296 (in the name of Kawasaki Jukogyo Kabushiki Kaisha) relates to a process for producing anatase titanium oxide having photocatalytic activity and large specific surface area. Anatase particles are prepared by a sol-gel method starting, for example, from a metal oxide or alkoxide heat treated in a closed vessel in the temperature range of 80 to 250° C. The examples show that a temperature of about 240° C. is necessary to obtain the anatase phase while operating at atmospheric pressure.

EP-A-1 182 169 (in the name of Japan Science and Technology Corporation) relates to a process for producing anatase titania or composite oxide containing anatase titania wherein a gel containing a metal oxide is formed from a solution containing a hydrolysable titanium compound and an organic polymer (e.g. polyethylene glycol), and subsequently the gel is allowed to react with water at a temperature of 100° C. or below.

Matsuda A. et al., J. Am. Ceram. Soc., 83 [1], 229-31, 2000 describe the preparation of transparent anatase nanocomposite films on various type of substrates, including organic polymers, using a sol-gel method at temperatures lower than 100° C. under ambient pressure. The homogeneous dispersion of titania particles in the matrix and control of the porosity cannot easily be attained. In the preparation of titania porous films, the particles have a tendency to aggregate in the sol and the resultant films usually become opaque. A large surface area, high transmittance of ultraviolet (UV) light and durability for photocatalytic activity are required for the host matrix in which anatase nanoparticles are dispersed without aggregation. This document proposes silica gel as matrix candidate. It is remarked that the formation of anatase nanocrystals is hardly observed in pure titania and is a unique phenomenon to the silica-titania system.

SUMMARY OF THE INVENTION

The Applicant faced the problem of obtaining a process for preparing a photovoltaic device including at least one film of a semiconductive metal oxide with a major amount of photocatalytic crystalline phase, said phase being nanosized and with a controlled porosity, by operating under non-destructive conditions so that a film of said semiconductive metal oxide can be deposited on a variety of substrates.

Such a goal is attained by preparing a semiconductive metal oxide with a major amount of nanosized photocatalytic crystalline phase, depositing a film thereof in the presence of a hydrosoluble organic polymer and a hydrolysable organic derivative of said metal, under non-destructive conditions.

The present invention relates to a process for preparing a photovoltaic device including at least one film of at least one semiconductive metal oxide with a major amount of a nanosized photocatalytic crystalline phase, said process comprising the steps of
  a) obtaining a semiconductive metal oxide with a major amount of photocatalytic crystalline phase;
  b) forming a suspension of the semiconductive metal oxide in an aqueous solution containing at least a hydrosoluble organic polymer and a hydrolysable organic derivative of said metal;
  c) depositing the resulting suspension on a substrate to give a film;
  d) treating said film at a temperature ranging between about 30° C. and about 100° C. in the presence of water.

Examples of photovoltaic devices obtainable by the method of the present invention are photovoltaic cells to be included in environmental sensor, e.g. gas sensors, remote power systems, electric systems for satellites, chip cards, e.g. smart cards, pocket calculators, watches.

In another aspect, the present invention relates to a process for preparing a film comprising at least one semiconductive metal oxide with a major amount of a nanosized photocatalytic crystalline phase, said process comprising the steps of
  a) obtaining a semiconductive metal oxide with a major amount of photocatalytic crystalline phase;
  b) forming a suspension of the semiconductive metal oxide in an aqueous solution containing at least a hydrosoluble organic polymer and a hydrolysable organic derivative of said metal;
  c) depositing the resulting suspension on a substrate to give a film;
  d) treating said film at a temperature ranging between about 30° C. and about 100° C. in the presence of water.

BRIEF DESCRIPTION OF THE DRAWING

The FIGURE (FIG. 1) shows the x-ray diffraction patterns (XRD) of a film prepared according to the invention and of a film prepared according to the prior art.

DETAILED DESCRIPTION OF THE INVENTION

Figure 1:
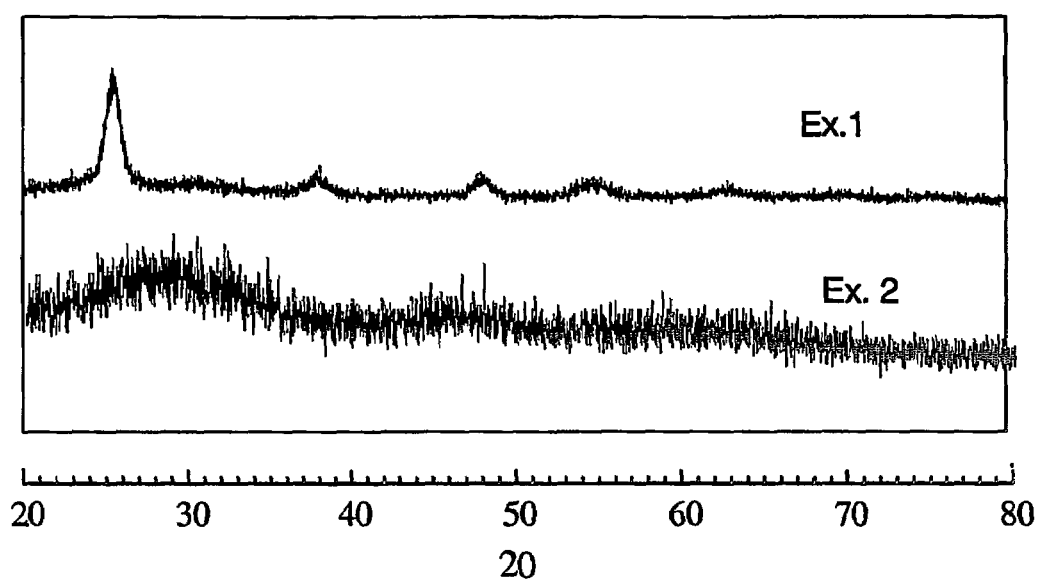

Examples of semiconductive metal oxides are oxides of titanium, zirconium, hafnium, strontium, zinc, indium, yttrium, lanthanum, vanadium, niobium, tantalum, chromium, molybdenum, tungsten. Preferred semiconductive metal oxide is titanium oxide (hereinafter referred to as "titania") with a major amount of anatase phase.

For example, films provided with the method according to the invention comprises nanosized photocatalytic crystalline phase in a percentage higher than 70% by weight, more preferably higher than 90% by weight, even more preferably, higher than 95% by weight.

Step a) of the present method may be carried out according to known technique. For example, in the case of titania, the anatase phase may be obtained by treating a hydrolysable precursor with an anhydrous alcohol, for example absolute ethanol, isopropanol or isobutanol, and water, and heating the resulting slurry at temperature ranging between about 300° C. and about 700°.

A hydrolysable precursor can be selected from alkoxides, chlorides and bromides. In the case of titania, e)samples are tetra-isopropoxy titanium, tetra-n-butoxy titanium, tetrakis (2-ethylhexyloxy)titanium, tetrastearyloxy titanium, and titanium tetrachloride.

Hydrosoluble organic polymer useful in the present invention can be polyvinylpyrrolidone, polyethylene glycol, polypropylene glycol, polytetramethylene glycol, cellulose acetate, cellulose nitrate, hydroxypropylcellulose, polyvinyl alcohol, polyvinyl acetate, polyvinyl chloride. Preferably, the hydrosoluble organic polymer is polyethylene glycol. Preferred polyethylene glycol according to the invention has molecular weight ranging between 600 and 300,000, preferably between 3,000 and 10,000.

When a hydrosoluble organic polymer according to the invention contains hydroxy groups, the percentage by weight of monomeric units bearing such groups is preferably lower than about 90%, more preferably lower than about 80%.

The hydrolysable organic derivative of said metal may be an ester derivative optionally containing one or more group/s selected from hydroxy, alkoxy, carbonyl and carboxy. In the case of titanium, it can be selected from titanium diisopropoxide bisacetyl acetonate, titanium dibutoxide bis2,4-pentanedionate, titanium lactate, titanium methacrylate triisopropoxide, titanium methacryloxyethylacetoacetate triisopropoxide, titanium oxide bispentanedionate, titanium oxide bistetramethylheptanedionate, titanium diisopropoxide bisethylacetoacetate, titanium diisopropoxide bistetramethylheptanedionate, titanium allylacetoacetatetriisopropoxide. Preferably the hydrolysable organic titanium derivative is titanium diusopropoxide bisacetyl acetonate (hereinafter referred to as TiACAC).

The aqueous solution of step b) preferably comprises a stabilizer.

The stabilizer can be an organic acid such as acetic acid, citric acid, propionic acid, butyrric acid, butylacetic acid, vinylacetic acid, ossalic acid, succinic acid, maleic acid, adipic acid, stearic acid, lactic acid. Preferably the stabilizer is acetic acid.

Preferably said aqueous solution shows a molar amount of stabilizer more than double with respect the hydrolysable organic derivative. More preferably the molar ratio hydrolysable organic derivative/stabilizer is of from about 1:4 to about 1:10.

The aqueous solution of step b) may be prepared from a first solution of hydrosoluble organic polymer and a second solution of a hydrolysable organic derivative of said metal. Preferably, said second solution has a molar ratio hydrolysable organic derivative/water of from about 1:1 to about 1:100. More preferably, said ratio is of from about 1:2 to about 1:20.

Preferably, step d) of the invention is performed at a temperature ranging between about 80° C. and about 100° C. The time of the treatment of step d) can range between about 2 hours and about 5 hours. Preferably, said step d) is preceded by a drying step. Said drying step can be performed at a temperature of about 70° C.-90° C.

The process of the present invention yields a photovoltaic devices including a semiconductive metal oxide with a major amount of nanosized photocatalytic crystalline phase, with porosity and thickness suitable for photocatalytic application on various kind of substrates. Due to the low temperature employed the film can be deposited on substrates with low thermal resistance, such as those based on organic polymers, too. Examples of substrates with low thermal resistance are polyethyleneterephthalate (PET), polyethylene (PE) and polyvinylchloride (PVC).

The presence of said hydrolysable organic derivative improves interconnections among the nanoparticles and enhance the electron percolation within the film.

In particular, said nanosized photocatalytic crystalline phase has a particle size ranging between about 1 and about 20 nm, preferably ranging between about 5 and about 10 nm.

The film provided by the method of the invention shows a porosity of about 40-80%, preferably about 50-60%.

The present invention will be now further illustrated by means of the following examples and FIG. 1 showing X-ray diffraction (XRD) patterns of a film prepared according to the invention and of a film prepared according to the prior art.

EXAMPLE 1

Titanium isopropoxide (8 ml, 97%, Aldrich) was added under stirring to absolute ethanol (92 ml, Carlo Erba Reagenti). The solution was drop-wise added, under vigorous stirring to a solution ethanol/distilled water (250 ml, 1:1 by weight). The resulting colloidal suspension was kept under stirring for 10 minutes.

Said suspension was heated at 100° C. for 15 hours, then at 400° C. per 2 hours to yield a powder containing more than 95% of anatase titania with a particle size of 5-10 nm, calculated from XRD line broadening measurements using Scherrer equation $$K \cdot l / FWHM \cdot Cos\, q$$

wherein K is the shape factor of the average crystallite;
l is the wavelength,
FWHM is the full width at half maximum of an individual peak, and
q is the peak position.

The obtained powder (1.5 g) was admixed to a solution A (3.5 g) composed by solution B (1.4 g) and solution C (2.1 g), solutions B and C having the following composition:

Solution B: 0.42 g of PEG 6000) (Aldrich) and 0.98 g of deionized water;
Solution C: Ti-ACAC (Aldrich)/acetic acid (CarloErba)/ $H_2O$ 1/6/8.

The resulting slurry was deposited, by doctor-blade, on a 1.13 mm thick 7.5×3 cm PET substrate (Eurotroniks S.r.l.) to give a 100 μm thick film. The film was treated at 90° C. for 1 hour, then at 90° C. for 3 hours in deionized water. The obtained film has the XRD (X-ray Diffraction) pattern of FIG. 1, showing an anatase percentage higher than 95%.

SEM (Scanning Electron Microscope) analysis showed that the film has a porosity of 60%.

EXAMPLE 2

A film was prepared according to what taught in EP 1 182 169, example 2.

Detection by X-Ray Diffraction carried on the film before the heat treatment in water showed that said film is composed by amorphous titania and PEG. After heat treatment in water a formation of anatase titania particles with a size of about 10-30 nm was observed, but in an amount lower then 10%, as from the XRD pattern of FIG. 1.

The invention claimed is:

1. A process for preparing a photovoltaic device including at least one film of at least one semiconductive metal oxide with a major amount of a nanosized photocatalytic crystalline phase, comprising the steps of:
   a) obtaining the at least one semiconductive metal oxide with a major amount of a photocatalytic crystalline phase;
   b) forming a suspension of the at least one semiconductive metal oxide with a major amount of a photocatalytic crystalline phase in an aqueous solution containing at least a hydrosoluble organic polymer and a hydrolysable organic derivative of metal of the metal oxide;
   c) depositing the resulting suspension on a substrate to give a film; and
   d) treating said film at a temperature between about 30° C and about 100° C in the presence of water.

2. The process according to claim 1, wherein the semiconductive metal oxide is titanium oxide with a major amount of anatase phase.

3. The process according to claim 1, wherein the hydrosoluble organic polymer is selected from polyvinylpyrrolidone, polyethylene glycol, polypropylene glycol, polytetramethylene glycol, cellulose acetate, cellulose nitrate, hydroxypropylcellulose, polyvinyl alcohol, polyvinyl acetate, and polyvinyl chloride.

4. The process according to claim 3, wherein the hydrosoluble organic polymer is polyethylene glycol.

5. The process according to claim 4, wherein the polyethylene glycol has a molecular weight between 600 and 300,000.

6. The process according to claim 5, wherein the polyethylene glycol has molecular weight between 3,000 and 10,000.

7. The process according to claim 3, wherein the hydrosoluble organic polymer contains monomeric units bearing hydroxy groups in a percentage lower than 90% by weight.

8. The process according to claim 1, wherein the hydrolysable organic derivative of metal of the metal oxide is an ester derivative.

9. The process according to claim 8, wherein said ester derivative contains one or more groups selected from hydroxy, alkoxy, carbonyl and carboxy.

10. The process according to claim 1, wherein the hydrolysable organic derivative of metal of the metal oxide is selected from titanium diisopropoxide bisacetyl acetonate, titanium dibutoxide bis2,4-pentanedionate, titanium lactate, titanium methacrylate triisopropoxide, titanium methacryloxyethylacetoacetate triisopropoxide, titanium oxide bispentanedionate, titanium oxide bistetramethylheptanedionate, titanium diisopropoxide bistetramethylheptanedionate, and titanium allylacetoacetatetriisopropoxide.

11. The process according to claim 10, wherein the hydrolysable organic derivative is titanium diisopropoxide bisacetyl acetonate.

12. The process according to claim 1, wherein the aqueous solution comprises a stabilizer.

13. The process according to claim 12, wherein the stabilizer is selected from acetic acid, citric acid, propionic acid, butyrric acid, butylacetic acid, vinylacetic acid, ossalic acid, succinic acid, maleic acid, adipic acid, stearic acid, and lactic acid.

14. The process according to claim 13, wherein the stabilizer is acetic acid.

15. The process according to claim 14, wherein the stabilizer is, in a molar amount, more than double with respect the hydrolysable organic titanium compound.

16. The process according to claim 15, wherein the molar ratio hydrolysable organic derivative/stabilizer is from 1:4 to 1:10.

17. The process according to claim 1, wherein step d) is performed at a temperature between 80° C and 100° C.

18. The process according to claim 1, wherein step d) is performed for a time between 2 hours and 5 hours.

19. The process according to claim 1, wherein said step d) is preceded by a drying step.

20. The process according to claim 1, wherein the photovoltaic device is a smart card.

21. A process for preparing a film comprising at least one semiconductive metal oxide with a major amount of a nanosized photocatalytic crystalline phase, comprising the steps of:

a) obtaining the at least one semiconductive metal oxide with a major amount of a photocatalytic crystalline phase;
b) forming a suspension of the at least one semiconductive metal oxide with at least one semiconductive metal oxide in an aqueous solution containing at least a hydrosoluble organic polymer and a hydrolysable organic derivative of said metal oxide;
c) depositing the resulting suspension on a substrate to give a film; and
d) treating said film at a temperature between about 30° C and about 100° C in the presence of water.

* * * * *